United States Patent
Basin et al.

(10) Patent No.: US 10,158,049 B2
(45) Date of Patent: Dec. 18, 2018

(54) METHOD OF BONDING A SUBSTRATE TO A SEMICONDUCTOR LIGHT EMITTING DEVICE

(75) Inventors: Grigoriy Basin, San Francisco, CA (US); John Edward Epler, San Jose, CA (US); Paul Scott Martin, Livermore, CA (US)

(73) Assignee: Lumileds LLC, San Jose, CA (US)

( * ) Notice: Subject to any disclaimer, the term of this patent is extended or adjusted under 35 U.S.C. 154(b) by 0 days.

(21) Appl. No.: 14/131,686

(22) PCT Filed: Jul. 30, 2012

(86) PCT No.: PCT/IB2012/053880
§ 371 (c)(1),
(2), (4) Date: Jan. 9, 2014

(87) PCT Pub. No.: WO2013/030690
PCT Pub. Date: Mar. 7, 2013

(65) Prior Publication Data
US 2014/0193931 A1    Jul. 10, 2014

Related U.S. Application Data

(60) Provisional application No. 61/528,886, filed on Aug. 30, 2011.

(51) Int. Cl.
*H01L 33/48* (2010.01)
*H01L 33/50* (2010.01)
(Continued)

(52) U.S. Cl.
CPC .......... *H01L 33/48* (2013.01); *H01L 21/6836* (2013.01); *H01L 24/83* (2013.01);
(Continued)

(58) Field of Classification Search
CPC ........ H01L 33/48; H01L 33/50; H01L 33/005
(Continued)

(56) References Cited

U.S. PATENT DOCUMENTS 5,261,157 A * 11/1993 Chang .............................. 29/844
6,087,202 A * 7/2000 Exposito et al. ............. 438/113
(Continued)

FOREIGN PATENT DOCUMENTS

CN        1845968 A      10/2006
DE   102008039790 A1     3/2010
(Continued)

OTHER PUBLICATIONS

JP Office Action, Application 2014-527757, dated Nov. 29, 2016, 5 pps.
(Continued)

*Primary Examiner* — Erik T Peterson
(74) *Attorney, Agent, or Firm* — Volpe and Koenig, P.C.

(57) ABSTRACT

A method according to embodiments of the invention includes positioning a flexible film (48) over a wafer of semiconductor light emitting devices, each semiconductor light emitting device including a semiconductor structure (13) including a light emitting layer sandwiched between an n-type region and a p-type region. The wafer of semiconductor light emitting devices is bonded to a substrate (50) via the flexible film (48). After bonding, the flexible film (48) is in direct contact with the semiconductor structures (13). The method further includes dividing the wafer after bonding the wafer to the substrate (50).

13 Claims, 2 Drawing Sheets

(51) Int. Cl.
 *H01L 33/00* (2010.01)
 *H01L 21/683* (2006.01)
 *H01L 23/00* (2006.01)
 *H01L 33/22* (2010.01)

(52) U.S. Cl.
 CPC ............ *H01L 24/94* (2013.01); *H01L 33/005* (2013.01); *H01L 33/0079* (2013.01); *H01L 33/50* (2013.01); *H01L 24/29* (2013.01); *H01L 24/32* (2013.01); *H01L 33/0095* (2013.01); *H01L 33/22* (2013.01); *H01L 33/501* (2013.01); *H01L 33/505* (2013.01); *H01L 33/507* (2013.01); *H01L 2224/0345* (2013.01); *H01L 2224/0346* (2013.01); *H01L 2224/05147* (2013.01); *H01L 2224/05155* (2013.01); *H01L 2224/05166* (2013.01); *H01L 2224/05644* (2013.01); *H01L 2224/05647* (2013.01); *H01L 2224/27436* (2013.01); *H01L 2224/29191* (2013.01); *H01L 2224/32225* (2013.01); *H01L 2224/83005* (2013.01); *H01L 2224/8309* (2013.01); *H01L 2224/83097* (2013.01); *H01L 2224/83191* (2013.01); *H01L 2224/83209* (2013.01); *H01L 2224/94* (2013.01); *H01L 2924/12041* (2013.01); *H01L 2924/12042* (2013.01); *H01L 2924/15788* (2013.01); *H01L 2933/0091* (2013.01)

(58) Field of Classification Search
 USPC .......................... 438/22, 26–29, 33; 313/512
 See application file for complete search history.

(56) References Cited

U.S. PATENT DOCUMENTS

| | | | |
|---|---|---|---|
| 7,053,419 B1 | 5/2006 | Camras et al. | |
| 7,489,068 B2 | 2/2009 | Hsieh et al. | |
| 7,560,294 B2 | 7/2009 | Suehiro et al. | |
| 7,622,363 B2 | 11/2009 | Yonehara et al. | |
| 7,858,198 B2 | 12/2010 | Kashiwagi et al. | |
| 9,287,469 B2 | 3/2016 | Chakraborty | |
| 2002/0012762 A1* | 1/2002 | Bunyan | 428/40.2 |
| 2003/0045021 A1* | 3/2003 | Akai | 438/99 |
| 2005/0158500 A1* | 7/2005 | Kitano et al. | 428/40.1 |
| 2007/0004065 A1* | 1/2007 | Schardt et al. | 438/26 |
| 2007/0009748 A1* | 1/2007 | Takanami et al. | 428/447 |
| 2007/0096131 A1* | 5/2007 | Chandra | H01L 33/505 257/99 |
| 2007/0110941 A1* | 5/2007 | Utesch et al. | 428/40.1 |
| 2007/0190280 A1* | 8/2007 | Harada et al. | 428/40.1 |
| 2007/0221866 A1* | 9/2007 | Sohn et al. | 250/484.4 |
| 2008/0197378 A1 | 8/2008 | Kong et al. | |
| 2008/0230177 A1* | 9/2008 | Crouser et al. | 156/275.5 |
| 2009/0078952 A1 | 3/2009 | Horng et al. | |
| 2009/0127575 A1 | 5/2009 | Horng et al. | |
| 2010/0140640 A1 | 6/2010 | Shimokawa et al. | |
| 2010/0295077 A1 | 11/2010 | Melman | |
| 2010/0327733 A1* | 12/2010 | Shaikevitch | C09J 7/0296 313/501 |
| 2010/0328923 A1* | 12/2010 | Shaikevitch | C09J 7/02 362/84 |
| 2011/0046320 A1 | 2/2011 | Katayama et al. | |
| 2011/0266560 A1* | 11/2011 | Yao | H01L 33/0079 257/88 |
| 2011/0297980 A1* | 12/2011 | Sugizaki | H01L 33/38 257/98 |
| 2011/0316031 A1* | 12/2011 | Ooyabu | H01L 33/505 257/98 |
| 2011/0316032 A1* | 12/2011 | Ooyabu | H01L 33/505 257/98 |
| 2012/0014640 A1* | 1/2012 | Nakashiba et al. | 385/14 |
| 2012/0052608 A1* | 3/2012 | Yoo | H01L 33/505 438/27 |
| 2012/0193669 A1 | 8/2012 | Gallmeier et al. | |
| 2012/0319575 A1* | 12/2012 | Nakamura | H01L 33/505 313/512 |
| 2013/0334956 A1* | 12/2013 | Bretschneider | H01L 33/507 313/498 |

FOREIGN PATENT DOCUMENTS

| | | |
|---|---|---|
| DE | 102009048401 A1 | 4/2011 |
| EP | 2194586 A1 | 6/2010 |
| JP | 2005-191476 A | 7/2005 |
| JP | 2006-041479 A | 2/2006 |
| JP | 2006-210916 A | 8/2006 |
| JP | 2007-042664 A | 2/2007 |
| JP | 2008-042143 A | 2/2008 |
| JP | 2008-205468 A | 9/2008 |
| JP | 2008-262993 A | 10/2008 |
| JP | 2010-135693 A | 6/2010 |
| JP | 2011-042760 A | 3/2011 |
| WO | 2008/062783 A1 | 5/2008 |

OTHER PUBLICATIONS

CN OA, 201280042515.7, dated Feb. 29, 2016, 17 pps.
EPO as ISA, PCT/IB2012/053880 filed Jul. 30, 2012, "International Search Report and Written Opinion", dated Nov. 9, 2012, 11 pages.
First Office Action, Taiwan Application No. 101131072, dated Nov. 18, 2015, 10 pages.
JP OA, Application 2014-527757, dated Apr. 19, 2016, 9 pps.
CN Office Action, Application 201280042515.7, dated Sep. 26, 2016, 12 pps.

* cited by examiner

METHOD OF BONDING A SUBSTRATE TO A SEMICONDUCTOR LIGHT EMITTING DEVICE

CROSS-REFERENCE TO PRIOR APPLICATIONS

This application is the U.S. National Phase application under 35 U.S.C. § 371 of International Application No. PCT/IB2012/053880, filed on Jul. 30, 2012, which claims the benefit of U.S. application No. 61/528,886 filed on Aug. 30, 2011. These applications are hereby incorporated by reference.

BACKGROUND

Field of Invention

The present invention relates to bonding a wafer of semiconductor light emitting devices to a substrate.

Description of Related Art

Semiconductor light-emitting devices including light emitting diodes (LEDs), resonant cavity light emitting diodes (RCLEDs), vertical cavity laser diodes such as surface-emitting lasers (VCSELs), and edge emitting lasers are among the most efficient light sources currently available. Materials systems currently of interest in the manufacture of high-brightness light emitting devices capable of operation across the visible spectrum include Group III-V semiconductors, particularly binary, ternary, and quaternary alloys of gallium, aluminum, indium, and nitrogen, also referred to as III-nitride materials. Typically, III-nitride light emitting devices are fabricated by epitaxially growing a stack of semiconductor layers of different compositions and dopant concentrations on a sapphire, silicon carbide, III-nitride, or other suitable substrate by metal-organic chemical vapor deposition (MOCVD), molecular beam epitaxy (MBE), or other epitaxial techniques. The stack often includes one or more n-type layers doped with, for example, Si, formed over the substrate, one or more light emitting layers in an active region formed over the n-type layer or layers, and one or more p-type layers doped with, for example, Mg, formed over the active region. Electrical contacts are formed on the n- and p-type regions.

FIG. 6 illustrates an LED die 4 bonded to a transparent lens 2, described in more detail in U.S. Pat. No. 7,053,419. LED die 4 includes a first semiconductor layer 80 of n-type conductivity and a second semiconductor layer 100 of p-type conductivity. Semiconductor layers 80 and 100 are electrically coupled to active region 120. N-contact 140 and p-contact 160 are disposed on the same side of LED die 4 in a flip chip configuration. Transparent superstrate 340 is formed from a material such as, for example, sapphire, SiC, GaN, or GaP. Lens 2 is bonded with bonding layer 6 to transparent superstrate 340. Bonding layer 6 may be silicone. Bonding layer 6 may include luminescent material that converts light of wavelengths emitted by active region 120 to other wavelengths. The luminescent material may be conventional phosphor particles.

SUMMARY

It is an object of the invention to provide a method of bonding a wafer of semiconductor light emitting devices to a substrate through a flexible film.

A method according to embodiments of the invention includes positioning a flexible film over a wafer of semiconductor light emitting devices, each semiconductor light emitting device including a semiconductor structure including a light emitting layer sandwiched between an n-type region and a p-type region. The wafer of semiconductor light emitting devices is bonded to a substrate via the flexible film. After bonding, the flexible film is in direct contact with the semiconductor structures. The method further includes dividing the wafer after bonding the wafer to the substrate.

DETAILED DESCRIPTION

Figure 6:
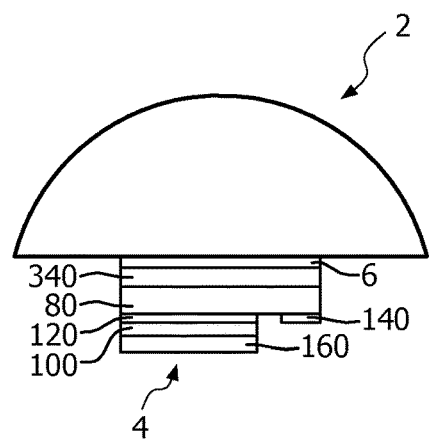
FIG. 6 illustrates a prior art LED die bonded to a transparent lens.

In the device illustrated in FIG. 6, lens 2 is attached to LED chip 4 after LED chip 4 is singulated from a wafer of LED chips.

In embodiments of the invention, a wafer of semiconductor light emitting devices including a light emitting region disposed between an n-type region and a p-type region is bonded to a substrate by a pre-formed silicone lamination film. As used herein, "wafer" refers to a structure before it is divided into smaller structures, such as a growth substrate on which has been grown semiconductor material for many light emitting devices. Though in the examples below the semiconductor light emitting devices are III-nitride LEDs that emit blue or UV light, semiconductor light emitting devices besides LEDs such as laser diodes and semiconductor light emitting devices made from other materials systems such as other III-V materials, III-phosphide, III-arsenide, II-VI materials, ZnO, or Si-based materials may be used.

Figure 1:
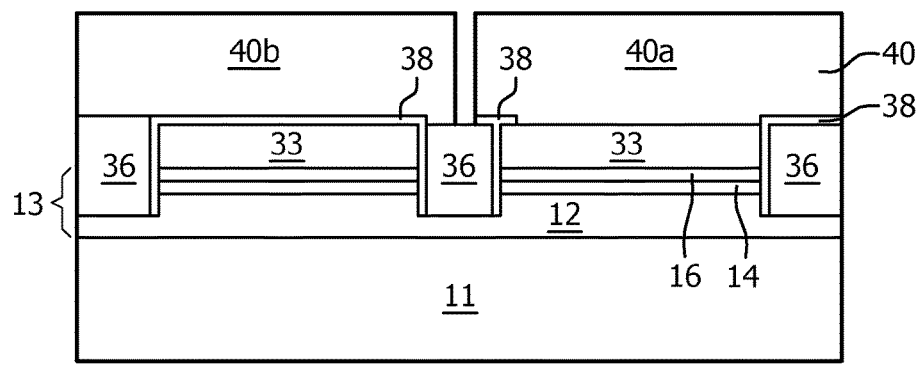
FIG. 1 illustrates a semiconductor light emitting device including a semiconductor structure grown on a growth substrate, metal n- and p-contacts, and bonding pads.

FIG. 1 illustrates a semiconductor light emitting device. To form the device illustrated in FIG. 1, a semiconductor structure 13 is grown on a growth substrate 11. Substrate 11 may be any suitable substrate such as, for example, sapphire, SiC, Si, GaN, or composite substrates. The semiconductor structure 13 includes a light emitting or active region 14 sandwiched between n- and p-type regions 12 and 16. An n-type region 12 may be grown first and may include multiple layers of different compositions and dopant concentration including, for example, preparation layers such as buffer layers or nucleation layers, and/or layers designed to facilitate removal of the growth substrate, which may be n-type or not intentionally doped, and n- or even p-type device layers designed for particular optical, material, or electrical properties desirable for the light emitting region to efficiently emit light. A light emitting or active region 14 is grown over the n-type region 12. Examples of suitable light emitting regions include a single thick or thin light emitting layer, or a multiple quantum well light emitting region including multiple thin or thick light emitting layers separated by barrier layers. A p-type region 16 may then be grown over the light emitting region 14. Like the n-type region 12, the p-type region 16 may include multiple layers of different composition, thickness, and dopant concentration, including layers that are not intentionally doped, or n-type layers. The total thickness of all the semiconductor material in the device is less than 10 μm in some embodiments and less than 6 μm in some embodiments. In some embodiments, the semiconductor material may optionally be annealed at between 200° C. and 800° C. after growth.

A p-contact 33 is formed on p-type region 16. P-contact 33 may be a multi-layer metal contact. A first metal layer in direct contact with p-type region 16 may be deposited by, for example, evaporation or sputtering, then patterned by standard photolithographic operations including, for example, etching or lift-off. The first metal layer may be a reflective metal that makes an ohmic contact with p-type III-nitride material such as, for example, silver. The first metal layer may also be a multi-layer stack of a transition metal and silver. The transition metal may be, for example, nickel. The first metal layer is between 100 Å and 2000 Å thick in some embodiments, between 500 Å and 1700 Å thick in some embodiments, and between 1000 Å and 1600 Å in some embodiments. The structure may optionally be annealed after deposition of the first metal layer. An optional second metal layer may be deposited over the first metal layer by, for example, evaporation or sputtering, then patterned by standard photolithographic operations such as, for example, etching or lift-off. The second metal layer may be any electrically-conductive material which reacts minimally with silver, such as, for example, an alloy of titanium and tungsten. This alloy may be nitrided either partially, wholly, or not at all. The second metal layer may alternatively be chromium, platinum or silicon, or may be a multi-layer stack of any of the above materials optimized for adhesion to surrounding layers and for blocking diffusion of the first metal layer. The second metal layer may be between 1000 Å and 10000 Å thick in some embodiments, between 2000 Å and 8000 Å in some embodiments, and between 2000 Å and 7000 Å thick in some embodiments.

The structure is then patterned by standard photolithographic operations and etched by, for example, reactive ion etching (RIE), where chemically reactive plasma is used to remove the semiconductor material, or inductively coupled plasma (ICP) etching, an RIE process where the plasma is generated by an RF-powered magnetic field. In some embodiments, the pattern is determined by the photolithographic mask used to pattern one or more of the p-contact metal layers. In these embodiments, etching may be performed subsequent to etching of the p-contact metal in a single operation. In one or more regions, the entire thickness of p-type region 16 and the entire thickness of light emitting region 14 are removed, revealing a surface of n-type region 12 (three such regions are illustrated in FIG. 1).

A metal n-contact 36 is formed on the portion or portions of n-type region 12 exposed by etching away the p-type region and the light emitting region. N-contact 36 may be any suitable metal including aluminum or a multi-layer stack of metals including aluminum, titanium-tungsten alloy, copper and gold. In embodiments where n-contact 36 is a multi-layer stack, the first metal (i.e. the metal adjacent to n-type region 12) may be selected to form an ohmic contact to GaN and to be reflective of blue and white light. Such a first layer may be, for example, aluminum. N-contact 36 may be deposited by any suitable process including, for example, sputtering, evaporation, plating, or a combination of these processes.

A dielectric 38 may be deposited over the structure, for example by plasma-enhanced chemical vapor deposition (PECVD), chemical vapor deposition (CVD), or evaporation. Dielectric 38 electrical isolates n-contact 36 and p-contact 33. Dielectric 38 is patterned by standard photolithographic operations and etched by ICP etching or RIE to expose n-contact 36 and p-contact 33. Dielectric 38 may be any suitable dielectric including silicon nitride, silicon oxide and silicon oxy-nitride. In some embodiments, dielectric 38 is a reflective stack. Dielectric 38 may be formed before or after n-contact 36.

Bonding pads 40a and 40b are formed over the n- and p-contacts and dielectric 38, to redistribute the n- and p-contacts into large conductive pads suitable for bonding to another structure such as, for example, a PC board. Bonding pads are typically metal but may be any suitable conductive material. Bonding pad 40a is electrically connected to p-type region 16 through p-contact 33. Bonding pad 40b is electrically connected to n-type region 12, through re-contact 36. Bonding pads 40 may be, for example, Cu, or a multi-layer metal stack comprising, for example Ti, TiW, Cu, Ni, and Au, deposited by sputtering, or by a combination of sputtering and plating. Bonding pads 40a and 40b may be electrically isolated by a gap, as illustrated in FIG. 1, or by a solid dielectric such as the materials described above in reference to dielectric 38.

Many of the devices illustrated in FIG. 1 are formed at the same time on a single wafer. The particular structure of light emitting device illustrated in FIG. 1 is not relevant to embodiments of the invention—any suitable light emitting device structure may be used.

Figure 2:
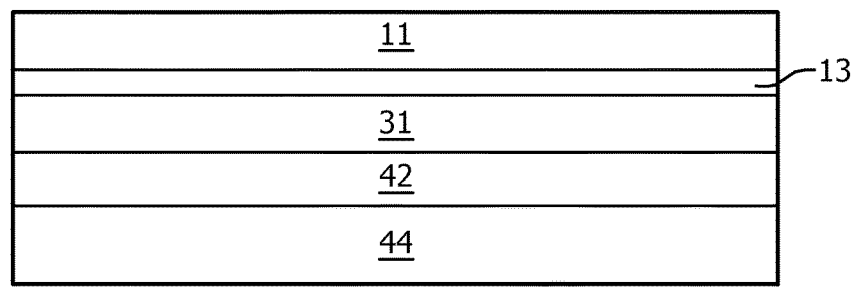
FIG. 2 illustrates a wafer of semiconductor light emitting devices bonded to a handle.

In FIG. 2, a wafer of devices such as, for example, the device illustrated in FIG. 1 is attached to a handle 44. The semiconductor structure 13 is attached to handle 44 through metal layers 31 and bonding layer 42. Metal layers 31 in FIGS. 2, 3, 4, and 5 include n- and p-contacts 36 and 33, dielectric 38, and bonding pads 40 described above and illustrated in detail in FIG. 1. Handle 44 mechanically supports semiconductor structure 13 during removal of growth substrate 11. Handle 44 may be, for example, glass, sapphire, silicon, or any other suitable material. A bonding layer may be formed on handle 44 only, on semiconductor structure 13 only, or on both handle 44 and semiconductor structure 13. The bonding layer or layers may be any suitable material, such as, for example, organic material such as silicone formed by any suitable technique such as, for example, spinning-on. After forming the bonding layer or layers, handle 44 and semiconductor structure 13 are pressed together under elevated temperature. The bond between handle 44 and semiconductor structure 13 does not require any alignment, since handle 44 is later removed and therefore contains no features that must be aligned with the individual light emitting devices on the wafer.

Figure 3:
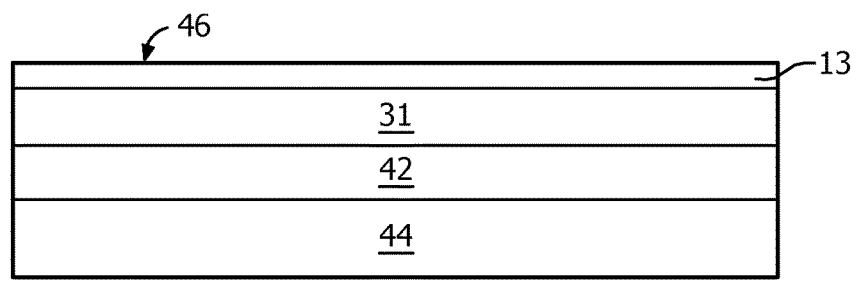
FIG. 3 illustrates the structure of FIG. 2 after removing the growth substrate and texturing the top surface of the semiconductor structure.

In FIG. 3, growth substrate 11 is removed from the wafer of semiconductor devices by any technique suitable to the growth substrate material including, for example, laser lift off, etching, or mechanical techniques. The surface 46 of semiconductor structure 13 exposed by removing growth substrate 11 (the surface of n-type region 12 at the interface with growth substrate 11 in FIG. 1) may be optionally thinned, then optionally textured, for example by roughening or by forming a pattern, to improve light extraction from the semiconductor structure 13. Surface 46 may be patterned by standard photolithography and etching and may be roughened by any suitable technique including, for example, etching such as photo-electrochemical etching in a KOH solution, mechanical grinding, or ablation.

Figure 4:
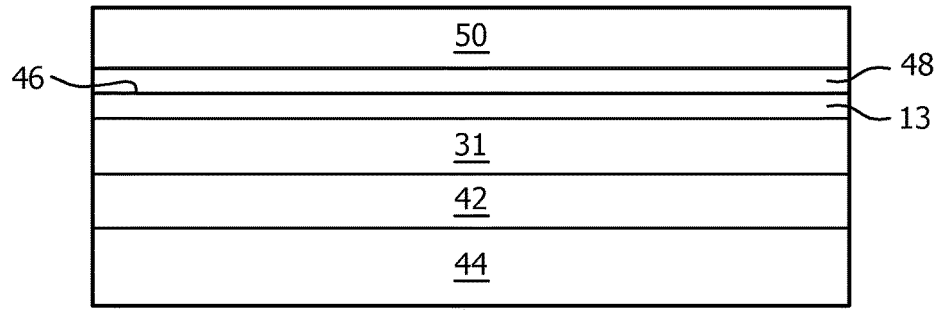
FIG. 4 illustrates the structure of FIG. 3 after bonding to a second substrate.

In FIG. 4, a bonding layer 48 is formed over the textured surface 46 of semiconductor structure 13. In some embodiments, bonding layer 48 is flexible film which may be fully or partially cured transparent material, such as silicone. The bonding film 48 may be formed separate from semiconductor structure 13 and substrate 50, which permits tight control of the thickness of the film as well as testing and verification of the characteristics of the film prior to attaching to semiconductor structure 13. In some embodiments, a heat dissipating material such as diamond may be added to the bonding film 48. In some embodiments, a material such as diamond, silica, $TiO_2$, and/or other inorganic additives may be added to the bonding film 48 to adjust the refractive index of the film, to improve optical transmission, to cause scattering of light, and/or to improve conversion by a wavelength converting material disposed in the film, as described below.

In some embodiments, bonding film 48 is formed on a support film such as an ethylene tetrafluoroethylene film, for example by spreading a mixture of silicone over the support film then fully or partially curing the silicone. The finished film is solid. In some embodiments, a protective film is formed over the bonding film 48 after forming the bonding film 48, such that bonding film 48 is sandwiched between a support film and a protective film. One of the support film and the protective film is removed before making the first bond with bonding film 48 (for example, to semiconductor structure 13), then the other of the support film and the protective film is removed before making the second bond with bonding film 48 (for example, to substrate 50).

Bonding film 48 is attached to semiconductor structure 13 or substrate 50 as follows. One of the support film and the protective film are removed followed pre-cure of bonding film 48. Bonding film 48 is pre-cured at between 100 and 150° C. for 1-10 minutes in order to achieve film hardness which prevents the silicone from melting during bonding, and which may maintain the targeted bonding film thickness over the semiconductor structure 13 or substrate 50. After bonding film 48 is pre-cured, it is attached in a first bonding step to the semiconductor structure 13. The structure including bonding film 48 and semiconductor structure 13 is loaded into a vacuum laminator to attach bonding film 48 to the surface 46 of semiconductor structure 13 using one or more of vacuum, elevated temperature, and elevated pressure. The temperature and pressure are balanced such that bonding film 48 maintains adhesive strength for the second bonding step described below. For example, bonding film 48 may be bonded to semiconductor structure 13 at temperatures between 60 and 100° C. in some embodiments, at pressures between 0.1 and 0.3 MPa in some embodiments, and under a vacuum of about $10^{-3}$ Torr in some embodiments.

The semiconductor structure 13 is then bonded to a substrate 50 via bonding layer 48. Substrate 50 may be a transparent, high refractive index material such as glass pre-formed into a substrate wafer before bonding to semiconductor structure 13. The index of refraction of the glasses above may be in the range of 1.5 to 2.2 or higher in some embodiments, closely matched to the refractive index of GaN (2.4). Suitable materials for substrate 50 include suitable high refractive-index glasses, such as lead chloride, lead bromide, potassium fluoride, zinc fluoride, an oxide of aluminum, antimony, bismuth, boron, lead, lithium, phosphorus, potassium, silicon, sodium, tellurium, thallium, tungsten, or zinc, or any mixtures thereof. High refractive-index glasses also include materials such as Schott glass LaSFN35, LaF10, NZK7, NLAF21, LaSFN18, SF59, or LaSF3, or Ohara glass SLAH51 or SLAM60, or mixtures thereof, glasses such as (Ge, As, Sb, Ga)(S, Se, Te, F, Cl, I, Br) chalcogenide and chalcogen-halogenide glasses, for example. In some embodiments, substrate 50 may include or be formed from lower index materials, such as glass, magnesium fluoride and polymers.

After bonding the bonding film 48 to semiconductor structure 13, the other of the support film and the protective film is removed from bonding film 48 and substrate 50 is positioned on top of bonding film 48. The structure is then placed in a second vacuum laminator which bonds substrate 50 to bonding film 48 under higher temperature and pressure than used in the first bonding step, in some embodiments. For example, substrate 50 may be bonded to bonding film 48 at temperatures between 110 and 120° C. in some embodiments. Though in the example above, bonding film 48 is attached to semiconductor structure 13 in a first bonding step and attached to substrate 50 in a second bonding step, in some embodiments, bonding film 48 is attached to substrate 50 in the first bonding step, then to semiconductor structure 13 in the second bonding step.

In some embodiments, one or more luminescent materials that convert light of wavelengths emitted by the light emitting region to other wavelengths are included in bonding film 48, substrate 50, or both. All or only a portion of the light emitted by the light emitting region and incident on the wavelength converting material may be converted by the wavelength converting material. Unconverted light emitted by the light emitting region may be part of the final spectrum of light, though it need not be. Examples of common combinations include a blue-emitting LED combined with a yellow-emitting wavelength converting material, a blue-emitting LED combined with green- and red-emitting wavelength converting materials, a UV-emitting LED combined with blue- and yellow-emitting wavelength converting material, and a UV-emitting LED combined with blue-, green-, and red-emitting wavelength converting materials. Wavelength converting materials emitting other colors of light may be added to tailor the spectrum of light emitted from the device. The wavelength converting material may be conventional phosphor particles, organic semiconductors, II-VI or III-V semiconductors, II-VI or III-V semiconductor quantum dots or nanocrystals, dyes, polymers, or materials such as GaN that luminesce. If one or both of substrate 50 and bonding layer 48 include conventional phosphor particles, in some embodiments the structure including the phosphor is thick enough to accommodate particles typically having a size of about 5 microns to about 50 microns. Any suitable phosphor may be used, including garnet-based phosphors such as $Y_3Al_5O_{12}$:Ce (YAG), $Lu_3Al_5O_{12}$:Ce (LuAG), $Y_3Al_{5-x}Ga_xO_{12}$:Ce (YAlGaG), $(Ba_{1-x}Sr_x)SiO_3$:Eu (BOSE), and nitride-based phosphors such as (Ca,Sr)$AlSiN_3$:Eu and $(Ca,Sr,Ba)_2Si_5N_8$:Eu. Different wavelength converting materials may be mixed together or formed as discrete layers. Wavelength converting materials may be incorporated into bonding film 48 and/or substrate 50 during fabrication of these structures. For example, wavelength converting material may be mixed with silicone before the silicone mixture is spread over the support film to form bonding film 48.

Figure 5:
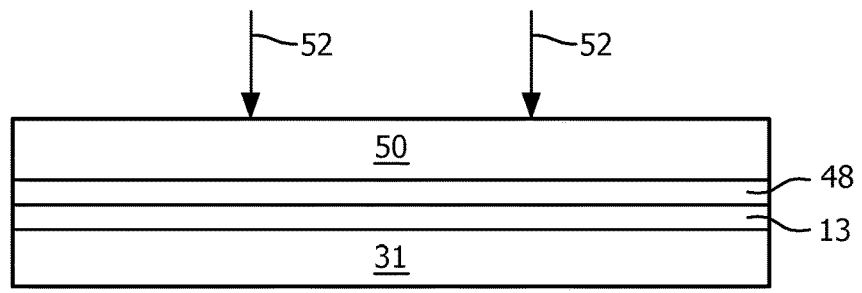
FIG. 5 illustrates the structure of FIG. 4 after removing the handle and dividing the wafer.

As illustrated in FIG. 5, after bonding to substrate 50, handle 44 is removed, for example by etching, mechanical separation, laser lift off, or any other suitable technique. Any bonding material 42 remaining after removing handle 44 is removed, for example by etching or other suitable technique. The wafer may then be divided into individual devices or groups of devices. The boundaries 52 between three structures separated from the wafer are illustrated in FIG. 5. Since the semiconductor structure 13 and substrate 50 are diced together, the substrate is no wider than the light emitting device, as illustrated in FIG. 5. Separation of the wafer into individual or groups of devices may be performed, for example, by conventionally sawing, by laser ablation using 193 nm, 248 nm, or 355 nm light, or by water jet cutting. Separation may also be performed via a combination of scribing and mechanical breaking, scribing being performed, for example, by conventionally sawing, by laser ablation using 193 nm, 248 nm, or 355 nm light, or by water jet cutting.

Having described the invention in detail, those skilled in the art will appreciate that, given the present disclosure, modifications may be made to the invention without departing from the spirit of the inventive concept described herein. Therefore, it is not intended that the scope of the invention be limited to the specific embodiments illustrated and described.

What is being claimed is:

1. A method comprising:
   positioning a pre-formed flexible bonding film over a plurality of light-emitting semiconductor structures to form a first intermediate structure, the bonding film including a first wavelength converting material;
   bonding the bonding film to the light-emitting semiconductor structures by applying a first temperature and a first pressure to the first intermediate structure;
   positioning a substrate over the bonding film to form a second intermediate structure, the substrate being positioned over the bonding film after the bonding film is bonded to the light-emitting semiconductor structures; and
   bonding the substrate to the bonding film by applying a second temperature and a second pressure to the second intermediate structure, the second temperature being higher than the first temperature, the second pressure being higher than the first pressure, and the first temperature and the first pressure being balanced to permit the binding film to maintain an adhesive strength that is sufficient for bonding the substrate to the bonding film while achieving a hardness that is sufficient to prevent the bonding film from melting during the bonding of the substrate to the bonding film; and
   dividing the second intermediate structure to produce a plurality of light-emitting devices.

2. The method of claim 1, wherein:
   each of the plurality of light-emitting semiconductor structures include a light-emitting layer sandwiched between an n-type region and a p-type region; and
   each of the plurality of light-emitting devices includes a different light-emitting semiconductor structure, a portion of the bonding film, and a portion of the substrate.

3. The method of claim 1, wherein the first wavelength converting material is phosphor.

4. The method of claim 1, wherein the bonding film is transparent.

5. The method of claim 1, wherein:
   the bonding of the bonding film to the light-emitting semiconductor structures is performed by using a first vacuum laminator, and
   the bonding of the substrate to the bonding film is performed by using a second vacuum laminator.

6. The method of claim 1 wherein the substrate is glass.

7. The method of claim 1, wherein the plurality of semiconductor structures is formed over a growth substrate, the method further comprising texturing a surface of the plurality of semiconductor structures exposed by removing the growth substrate.

8. The method of claim 7, wherein the bonding film is positioned over the textured surface.

9. The method of claim 1, wherein prior to being positioned over the plurality of semiconductor structures, the bonding film is sandwiched between a support film and a protective film, the method further comprising removing one of the support film and the protective film prior to attaching the bonding film to the plurality of semiconductor structures.

10. The method of claim 9, further comprising removing the other of the support film and the protective film prior to positioning the substrate over the bonding film.

11. The method of claim 1, wherein the bonding of the bonding film to the plurality of light-emitting semiconductor structures includes vacuum laminating the bonding film to the plurality of semi-conductor structures.

12. The method of claim 1, wherein bonding the substrate to the bonding film includes vacuum laminating the substrate to the bonding film.

13. The method of claim 1, wherein the substrates comprises a second wavelength converting material.

* * * * *